(12) United States Patent
Bridges et al.

(10) Patent No.: US 7,744,178 B2
(45) Date of Patent: Jun. 29, 2010

(54) RACK-MOUNTED RAIL SYSTEM

(75) Inventors: Jeremy Bridges, Apex, NC (US); John G. Gundlach, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 817 days.

(21) Appl. No.: 11/184,210

(22) Filed: Jul. 19, 2005

(65) Prior Publication Data

US 2007/0018546 A1 Jan. 25, 2007

(51) Int. Cl.
*A47B 88/00* (2006.01)
(52) U.S. Cl. .................................. 312/334.47
(58) Field of Classification Search ............... 312/223.1, 312/223.2, 332.1, 333, 334.4, 334.5, 334.1, 312/334.8; 211/189, 191, 192, 26, 187; 292/137, 292/145, 146, 150, 302
See application file for complete search history.

(56) References Cited

U.S. PATENT DOCUMENTS

| | | | | |
|---|---|---|---|---|
| 2,928,696 | A * | 3/1960 | Hiers | 384/19 |
| 5,520,069 | A * | 5/1996 | Rynders et al. | 74/520 |
| 6,008,984 | A * | 12/1999 | Cunningham et al. | 361/685 |
| 6,209,979 | B1 * | 4/2001 | Fall et al. | 312/330.1 |
| 6,256,194 | B1 * | 7/2001 | Choi et al. | 361/683 |
| 6,370,022 | B1 * | 4/2002 | Hooper et al. | 361/685 |
| 6,601,933 | B1 * | 8/2003 | Greenwald | 312/333 |
| 6,654,240 | B1 * | 11/2003 | Tseng et al. | 361/685 |
| 6,997,528 | B2 * | 2/2006 | Yang | 312/333 |
| 2001/0037985 | A1 * | 11/2001 | Varghese et al. | 211/26 |
| 2004/0114320 | A1 * | 6/2004 | Williams et al. | 361/685 |

\* cited by examiner

*Primary Examiner*—Janet M Wilkens
*Assistant Examiner*—Matthew W Ing
(74) *Attorney, Agent, or Firm*—Cynthia G. Seal, Esq.; Steven M. Greenberg, Esq.; Carey, Rodriguez, Greenberg & Paul, LLP

(57) ABSTRACT

A racking system for storing equipment in a rack includes a rail that is configured to be attached to the rack and a housing that receives the equipment. One of the housing and rail includes a catch, and the other of the housing and the rail includes a slot for engaging the catch. The catch is movable between a first position and a second position. In the first position, the catch engages the slot and extends away from a surface of either the housing and the rail, and in the second position, the catch is withdrawn from engaging the slot. The catch rotates upon moving between the first position and the second position, and the catch is biased towards the first position.

14 Claims, 4 Drawing Sheets

RACK-MOUNTED RAIL SYSTEM

BACKGROUND OF THE INVENTION

1. Field of the Invention

The disclosure relates generally to racking systems for equipment and, more specifically, to a system for enabling in-rack servicing of rack-mounted equipment.

2. Description of the Related Art

For equipment, such as computer servers and audio/video devices, mounted in a racks, there is an occasional need to adjust and/or service the equipment without completely removing the equipment from the rack. For example, the complete removal of the equipment from the rack may require the disconnection of one or all of a multitude of cables/connectors to which the equipment is attached. Although the cables/connectors may not have enough slack to permit complete removal of the equipment from the rack, there may be enough slack to permit partial removal of the equipment.

Two current devices used to connect the equipment to the rack are commonly known as slides and rails. Rails are typically mechanically simpler than slides and usually have a L-shaped cross-section. The vertical portion of the L-shaped cross-section is connected to the rack and the equipment rests on the horizontal portion of the L-shaped cross-section. Although both space- and cost-efficient, equipment mounted on rails are typical not considered to be rack serviceable. The space-efficiency of the rail can be attributed, at least in part, to only the vertical portion of the L-shaped cross-section being between the rack and a housing of the equipment.

As an example, for a rail-mounted piece of equipment that is partially removed from a rail for servicing, the rail only provides support in a single direction for that portion of the equipment resting on the rail. If force, either from the user maintaining the equipment or the weight of the equipment cantilevered from the rack, is sufficiently large, the equipment may rotate/tip, which can cause damage to the equipment itself or the cables/connectors to which the equipment is attached.

To prevent the tipping of the piece of equipment in the rack, slides have been developed that enable the equipment to be partially removed from the rack. Many different types of slides are known with many types of configurations. A common configuration is a two-piece system in which a first piece is connected to the rack and a second piece is connected to the equipment, and the first and second pieces slide relative to one another. An issue arising with the use of slides, however, is that the slides take up horizontal space within the rack. For a given horizontal size of a housing of a piece of equipment, a rack using slides requires about ¾" more space in a horizontal direction than a rack using rails. Since, in many applications, space is limited, there is a need for a racking system that combines the space-efficiency of rails with the in-rack service capability of slides.

BRIEF SUMMARY OF THE INVENTION

Embodiments of the invention address deficiencies of the art in respect to racking systems and provide a novel and non-obvious system for storing equipment within a rack. A racking system includes a rail that is configured to be attached to a rack and a housing that receives equipment. One of the housing and rail includes a catch, and the other of the housing and the rail includes a slot for engaging the catch. The catch is movable between a first position and a second position. In the first position, the catch engages the slot and extends away from a surface of either the housing and the rail, and in the second position, the catch is withdrawn from engaging the slot. The catch rotates upon moving between the first position and the second position, and the catch is biased towards the first position.

The housing includes the catch, and the rail includes the slot. Also, the rail includes a horizontal portion and a vertical portion, and the slot is positioned in the vertical portion. In the second position, the catch is positioned in a recess of the housing and no portion of the catch extends beyond a side surface of the housing that is proximate the rail. A latch is included and is connected to the catch for moving the catch between the first and second positions. The latch is positioned within a recess of the housing and no portion of the latch extends beyond a side surface of the housing that is proximate the rail.

The slot includes a receiving portion and in a first position of the rail relative to the housing with the catch proximate the receiving portion, the catch is movable between the first position of the catch and the second position of the catch. The slot also includes a traversing portion, and in a second position of the rail relative to the housing while the catch is engaged within the traversing portion of the slot, the catch is unmovable into the second position of the catch.

The slot includes a notch portion, and the notch portion includes a surface that is positioned at a different height than heights of surfaces of the traversing portion. In a third position of the rail relative to the housing and the catch engaged within the notch portion of the slot, the catch is unmovable into the second position. The notch portion is positioned closer to the front of the rail than the receiving portion, and the notch portion is positioned proximate the receiving portion.

The catch includes a modified U-shaped exterior profile, and the exterior profile of the catch includes an angled portion. The slot includes an angled slot portion, and in a fourth position of the rail relative to the housing while the catch is engaged within the angled slot portion of the slot, motion of the housing relative to the rail towards a rear of the rail moves the catch to a third position of the catch between the first and second positions of the catch. The angled portion of the catch engaging the angled slot portion moves the catch to the third position of the catch. In the third position, the catch is disengaged from the slot and the catch is biased against a side surface of the rail.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 1:
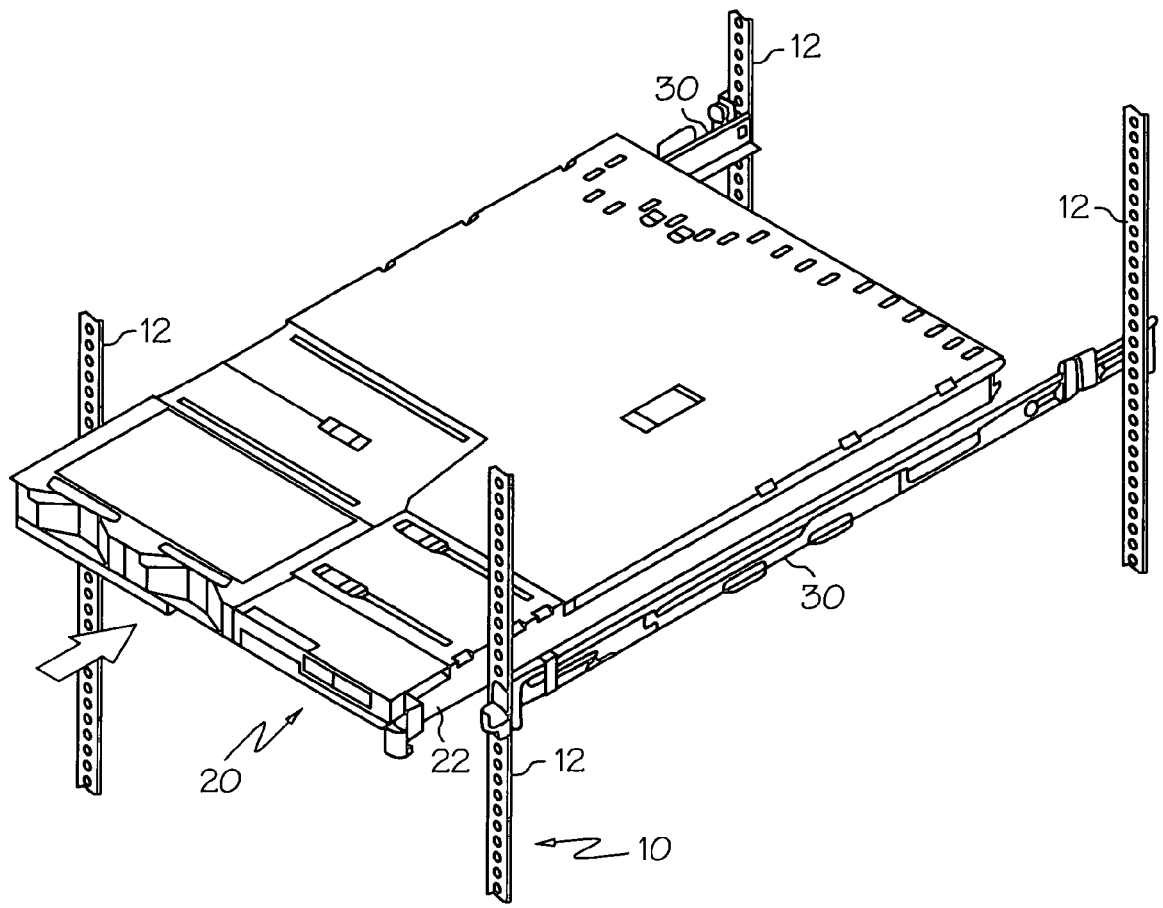
FIG. 1 is a perspective illustration of a piece of equipment and racking system in accordance with the inventive arrangements.
Figure 2:
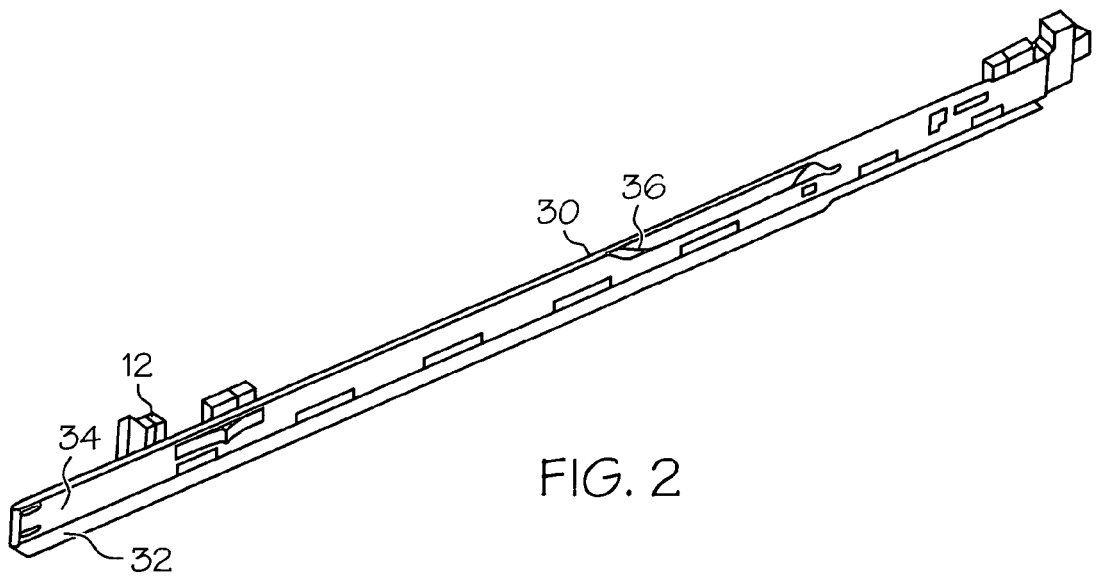
FIG. 2 is a perspective illustration of a rail of the racking system.

FIGS. 1 and 2 respectively illustrate a racking system for slidably connecting a piece of equipment 20 into a rack 10 using rails 30. The equipment 20 is not limited as to particular type. For example, although FIG. 1 illustrates that the equipment 20 is a computer server, other examples of equipment include controllers, audio equipment, and video equipment, such as receivers, amplifiers, and DVD players. The racking system includes a chassis for and/or housing of the equipment. The chassis/housing 22 is connected to the supports 12 of the rack 10 using the rails 30.

Although not limited in this manner, the rail 30 may include a horizontal portion 32 for supporting the chassis/housing 22 and a vertical portion 34 that may be connected to the supports 12 of the rack 10. A slot 36 may also be included in the vertical portion 34 for receiving a portion of the racking system associated with the chassis/housing 22.

Figure 3A:
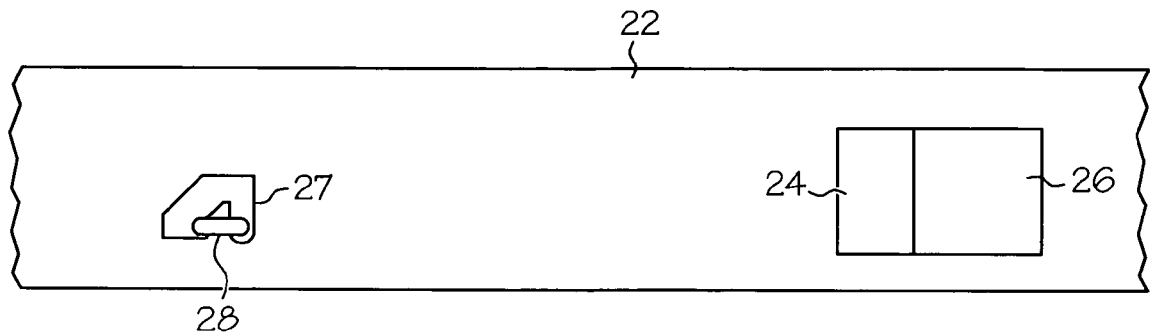
FIGS. 3A-3B are side views of the piece of equipment including a catch and latch of the racking system.
Figure 3B:
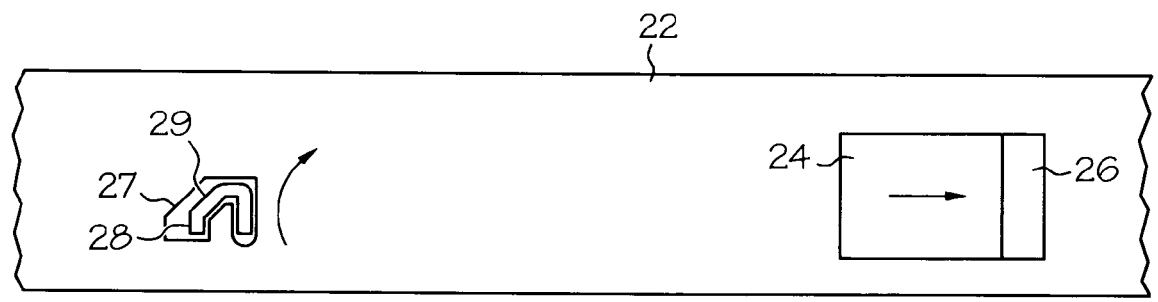

FIGS. 3A and 3B illustrate a latch 26 and catch 28 of the racking system that are associated with chassis/housing 22 for the equipment 20. In a first position of the catch 28 (FIG. 3A), the catch 28 extends away from a side surface of the chassis/housing 22 to enable the catch 28 to engage (shown in FIG. 4) the slot 36 of the rail 30. In a second position of the catch 28 (FIG. 3B), the catch 28 is withdrawn from the first position and does not engage the slot 36. Although the present racking system is described with the slot 36 positioned in the rail 30 and the catch 28 positioned in the chassis/housing 22, in an alternative aspect of the racking system, the slot 36 is positioned in the chassis/housing 22 and the catch 28 is positioned in the rail.

Although not limited in this manner, the catch 28 is biased to return to the first position using, for example, a spring (not shown). In certain aspects of the racking system, the catch 28 is biased in a direction opposite a direction in which movement of the chassis/housing 22 relative to the rail 30 is desired to be prevented. For example, referring to FIG. 1, a desire may be to prevent an end of the chassis/housing 22 that is connected to the rail 30 from rotating upward, and thus, the catch 28 is biased in a downward direction.

The manner in which the catch 28 is withdrawn from the first position is not limited. For example, the catch 28 may be withdrawn in a linear motion, or as illustrated, the catch 28 may rotate into the second position. In certain aspects of the rack system, in the second position of the catch 28, the catch 28 is positioned within a recess 27 of the chassis/housing 22 such that no portion of the catch 28 extends beyond the side surface of the chassis/housing 22 proximate the rail 30. In this manner, the side surface of the chassis/housing 22 may be positioned closer to the rail 30.

The catch 28 may have different types of shapes. For example, the catch 28 may be configured to be in the shape of a pin (i.e., an elongated cylinder). In certain aspects of the racking system, the catch 28 has a modified U-shape exterior profile with an angled portion 29. As will be described with regard to FIGS. 4C and 4D, the angled portion 29 of the catch 28 allows the catch 28 to slide along a side of an angled slot portion 42 of the slot 36.

The latch 26 functions to change the position of the catch 28 between the first position (extended) to the second position (withdrawn). Many different types of latches 26 are known to be capable of changing the position of the catch 28 from one position to another, and the racking system is not limited to any latch 26 so capable. In certain aspects of the racking system, as illustrated in FIG. 3B, by pulling on the latch 26 in a certain direction, for example, towards a front of the chassis/housing 22, the catch 28 is rotated from the first position into the second position.

In certain aspects of the racking system, the latch 26 is positioned within a second recess 24 within the chassis/housing 22 such that no portion of the latch 26 extends beyond the side surface of the chassis/housing 22 proximate the rail 30. In this manner, the side surface of the chassis/housing 22 may be positioned closer to the rail 30.

Figure 4A:
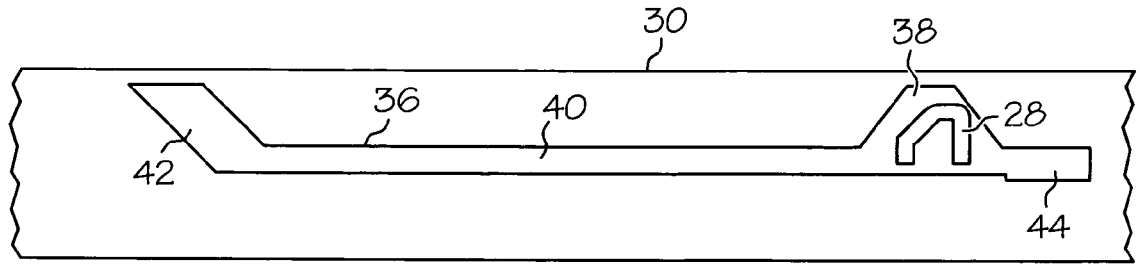
FIGS. 4A-4E are side views of the catch at different positions relative to the rail.

Various positions of the catch 28 relative to the slot 36 of the rail 30 are illustrated in FIGS. 4A-4E. For ease of viewing, only the catch 28 and no other portion of racking system within the chassis/housing 22 or the chassis/housing 22 itself is shown. FIG. 4A illustrates the catch 28 in the second position (withdrawn) and located proximate to a receiving portion 38 of the slot 36. In this location, the catch 28 may either be engaged or disengaged from the slot 36. When the catch 28 is engaged within the slot 36, the equipment 20 cannot be completely removed from the rail 30, and when the catch 28 is disengaged from the slot 36, the equipment can be completely removed from the rail 30.

To engage the slot 36, the catch 28 in the second position is located adjacent the receiving portion 38 and the catch 28 is moved into the first position (not shown). This allows the catch 28 to subsequently move along a main/traversing portion 40 of the slot 36 (illustrated in FIG. 4B). To disengage the catch 28 from the slot 36, the catch 28, which is initially in the first position in the slot 36, is moved from the first position into the second position when the catch 28 is adjacent the receiving portion 38. Since, in the second position, the catch 28 may no longer extend beyond a side surface of the chassis/housing 22, the catch 28 may no longer interfere with movement of the chassis/housing 22 relative to the rail 30.

The shape of the receiving portion 38 may be influenced by the shape of the catch 28 and how the catch 28 moves from the first position into the second position and back again. For example, in a configuration where the catch 28 rotates upward, a top surface of the receiving portion 38 may be positioned away from a bottom surface of a main/traversing portion 40 of the slot 36 at least as great as a height of the catch 28 in the second position. The height of the receiving portion 38 may also depend on an angle of rotation at which the catch 28 engages the slot 36 and the height of the catch 28 at that angle of rotation.

As an example, if the catch 28 engages the slot 36 at a greater angle (e.g., closer to 90°), the height of the receiving portion 38 may be higher than if the catch 28 engages the slot 36 at a lower angle (e.g., closer to 0°). Another factor that may affect the height of the receiving portion 38 is a distance from the slot 36 (i.e., the rail 30) to the catch 28 (i.e., the chassis/housing 22). For a given height of the catch 28, as a distance from the catch 28 to the slot 36 increases, a height of the receiving portion 38 necessary for the receiving portion 38 to receive the catch 28 decreases since the catch 28 will engage the receiving portion 38 of the slot 36 at a lower angle. Conversely, for a given height of the catch 28, as a distance from the catch 28 to the slot 36 decreases, a height of the receiving portion 38 increases.

Figure 4B:
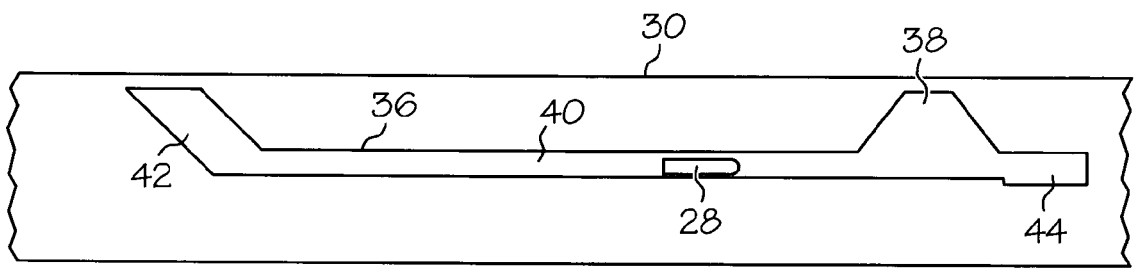

In FIG. 4B, the catch 28 is in the first position (extended) and is engaged with a main/traversing portion 40 the slot 36. While engaged with the slot 36, upward motion of the catch 28 may be prevented by the aforementioned biasing of the catch 28 in the downward direction. In this manner, rotation/tipping of the equipment 20 within the rack 10 can be prevented.

A height of the main/traversing portion 40 of the slot 36 is determined by the width of the catch 28 and a desired tolerance. With little clearance between the catch 28 and the slot 36 movement of the catch 28 may be difficult. However, a great amount of clearance between the catch 28 and the slot 36 allows for substantial rotation of the chassis/housing 22 relative to the rail. Although not limited in this manner, in certain aspects of the racking system, the height of the main/traversing portion 40 of the slot 36 is between about 1.5 to 2.0 times the width of the catch 28.

Figure 4C:
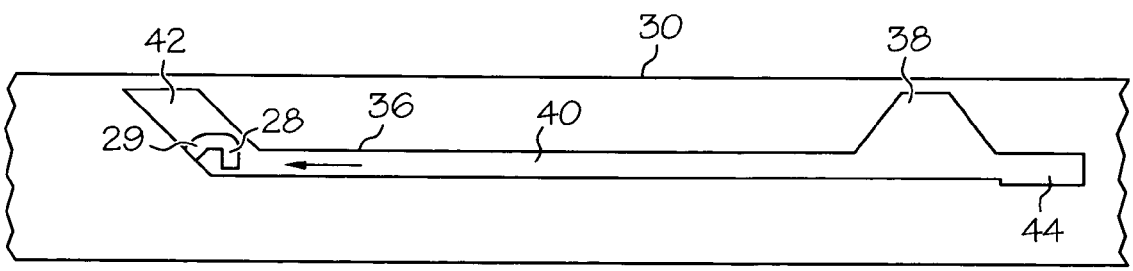
Figure 4D:
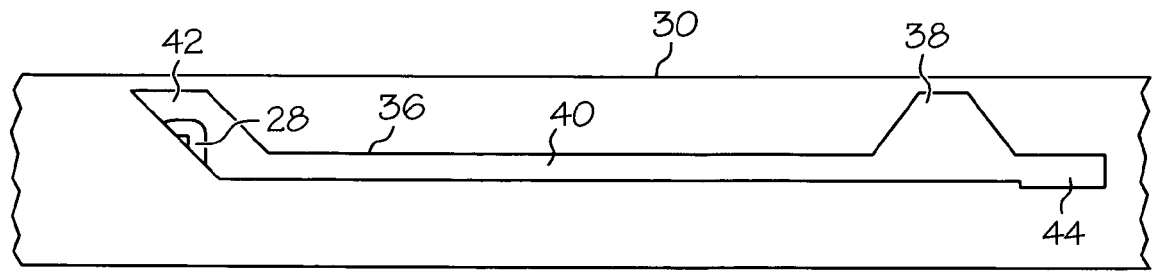

FIGS. 4C and 4D illustrate use of an angled slot portion 28 that may be included in the slot 36 and is positioned towards a rear of the rail 30. As shown in FIG. 4C, a side surface of the angled slot portion 42 engages the angled portion 29 of the catch 28 when the catch 28 is moved relative to the rail 30 in a direction shown by an arrow towards a rear of the rail 30. As the catch 28 is continued to be moved relative to the rail 30 in the direction shown by the arrow, upward force is exerted on the angled portion 29 of the catch 28 by the side surface of the angled slot portion 42. This force counteracts the aforementioned biasing force against the catch 28 and acts to rotate the catch 28 into a third position between the first and second positions.

As the catch 28 still continues to move relative to the rail 30 in the direction such that the catch 28 no longer engages the slot 36 (not shown), the catch 28 may still be biased against a side surface of the rail 30. Friction between the catch 28 and the side surface of the rail 30 may act to hamper motion both linearly and rotationally of the chassis/housing 22 relative to the rail 30. In certain aspects of the racking system, the angled slot portion 42 is positioned so that when the catch 28 no longer engages the slot 36, a position of a center of gravity of equipment 20 in the chassis/housing 22 is over the rail 30. In this manner, the equipment 20 may be stably located on the rails 30 of the rack 10.

Figure 4E:
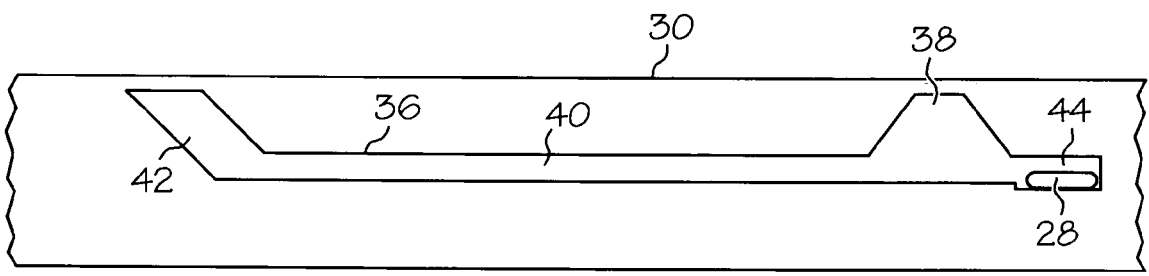

FIG. 4E illustrates the use of a notch portion 44 of the slot 36 that may be included in the slot 36 in a direction towards a front of the rail 30. In this location, the chassis/housing 22 may be fully extended relative to the rail 30 while the catch 28 is engaged within the slot 36.

The notch portion 44 may be configured to provide a user extending the chassis/housing 22 with a tactile indication that the chassis/housing 22 has reached a fully extended position. Although not limited in the manner in which a tactile response is provided, the notch portion 44 includes a surface positioned at a different height than the surfaces of the main/traversing portion 40 of the slot 36. In this manner, as the catch 28 traverses the main/traversing portion 40 and reaches the notch portion 44, the change in level of the respective surfaces of the portions 40, 44 creates a tactile indication that the chassis/housing 22 has reached a fully extended position.

The relative location of the slot 36 at a fully extended position of the chassis/housing 22 to the receiving portion 38 is not limited. However, in certain aspects of the racking system the receiving portion 38 is positioned slightly rearward of the position of the slot 36 at the fully extended position of the chassis/housing 22. Otherwise, if the receiving portion 38 of the slot 36 was located at the fully extended position of the chassis/housing 22, the relative height of the receiving portion 38 would allow for greater rotation of the chassis/housing 22 relative to the rail 30.

Additionally, by positioning the receiving portion 38 slightly rearward of the fully extended position of the chassis/housing 22 within the slot 36, such as within 1 to 3 widths of the catch 28, a user can easily determine a position of the receiving portion 38 when the catch 28 is engaged within slot 36 by first moving the chassis/housing 22 to the fully extended position and then moving the chassis/housing 22 slightly in a direction towards a rear of the rail 30 while pushing slightly downward on the chassis/housing 22. Upon the chassis/housing 22 tilting upward, a determination can be made that the catch 28 is at the receiving portion 38.

What is claimed is:

1. A racking system for storing equipment in a rack, comprising:
   a rail configured to be attached to the rack; and
   a housing for receiving the equipment, wherein
   one of the housing and the rail includes a catch, and an other of the housing and the rail includes a slot for engaging the catch,
   the catch movable between a first position and a second position,
   in the first position, the catch engaging the slot and the catch extends away from a surface of the one of the housing and the rail,
   in the second position, the catch is withdrawn from engaging the slot,
   the slot includes a receiving portion and in a first position of the rail relative to the housing with the catch proximate the receiving portion, the catch movable between the first position of the catch and the second position of the catch,
   the slot includes a traversing portion, and
   in a second position of the rail relative to the housing and the catch engaged within the traversing portion of the slot, the catch is unmovable into the second position of the catch, wherein
   the catch rotating from a substantially horizontal orientation to a substantially vertical orientation upon moving between the first position and the second position.

2. The racking system according to claim 1, the housing includes the catch, and the rail includes the slot.

3. The racking system according to claim 2, wherein the rail includes a horizontal portion and a vertical portion, and the slot is positioned in the vertical portion.

4. The racking system according to claim 1, further comprising a latch connected to the catch for moving the catch between the first position and the second position.

5. The racking system according to claim 4, wherein the latch positioned in a recess of the housing and no portion of the latch extending beyond a side surface of the housing proximate the rail.

6. The racking system according to claim 1, wherein the catch is biased towards the first position.

7. The racking system according to claim 1, wherein
   the slot includes a notch portion,
   the notch portion includes a surface positioned at a different height than heights of surfaces of the traversing portion, and
   in a third position of the rail relative to the housing and the catch engaged within the notch portion of the slot, the catch is unmovable into the second position.

8. The racking system according to claim 7, wherein the notch portion is positioned closer to a front of the rail than the receiving portion.

9. The racking system according to claim 7, wherein the notch portion is positioned proximate the receiving portion.

10. The racking system according to claim 1, wherein the catch includes a modified U-shaped exterior profile.

11. The racking system according to claim 1, wherein an exterior profile of the catch includes an angled portion.

12. The racking system according to claim 11, wherein the slot includes an angled slot portion, and in a fourth position of the rail relative to the housing and the catch engaged within the angled slot portion of the slot, motion of the housing relative to the rail towards a rear of the rail moving the catch to a third position of the catch between the first and second positions of the catch.

13. The racking system according to claim 12, in the third position the catch, the catch disengaged from the slot and the catch biased against a side surface of the rail.

14. The racking system according to claim 12, wherein the angled portion of the catch engaging the angled slot portion moves the catch to the third position of the catch.

* * * * *